US011268535B2

(12) United States Patent
Lin et al.

(10) Patent No.: US 11,268,535 B2
(45) Date of Patent: Mar. 8, 2022

(54) FAN MODULE

(71) Applicant: ASUSTeK COMPUTER INC., Taipei (TW)

(72) Inventors: Hsin-Chen Lin, Taipei (TW); Ing-Jer Chiou, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 17/006,955

(22) Filed: Aug. 31, 2020

(65) Prior Publication Data

US 2021/0062820 A1    Mar. 4, 2021

(30) Foreign Application Priority Data

Sep. 3, 2019    (TW) ................. 108131744

(51) Int. Cl.
| | |
|---|---|
| *F04D 17/16* | (2006.01) |
| *F04D 29/28* | (2006.01) |
| *F04D 29/62* | (2006.01) |
| *F04D 29/32* | (2006.01) |
| *H05K 7/20* | (2006.01) |

(52) U.S. Cl.
CPC ......... *F04D 29/281* (2013.01); *F04D 29/325* (2013.01); *F04D 29/329* (2013.01); *F04D 29/624* (2013.01); *F04D 17/16* (2013.01); *F05D 2260/36* (2013.01); *H05K 7/20172* (2013.01)

(58) Field of Classification Search
CPC ...... F04D 17/16; F04D 29/281; F04D 29/325; F04D 29/329; F05D 2260/36
See application file for complete search history.

(56) References Cited

U.S. PATENT DOCUMENTS

| | | | | |
|---|---|---|---|---|
| 5,611,668 | A * | 3/1997 | Yapp | F04D 29/023 416/189 |
| 6,540,479 | B2 * | 4/2003 | Liao | F04D 29/542 361/697 |
| 6,572,336 | B2 * | 6/2003 | Horng | F04D 29/023 416/183 |
| 6,779,992 | B2 * | 8/2004 | Lei | F04D 29/023 416/198 R |
| 7,182,572 | B2 * | 2/2007 | Yang | F04D 29/325 415/175 |

FOREIGN PATENT DOCUMENTS

| | | |
|---|---|---|
| CN | 1766346 A | 5/2006 |
| CN | 201925226 U | 8/2011 |
| CN | 204419698 U | 6/2015 |
| TW | M421993 U | 2/2012 |

\* cited by examiner

*Primary Examiner* — Ninh H. Nguyen
(74) *Attorney, Agent, or Firm* — McClure, Qualey & Rodack, LLP (57) ABSTRACT

A fan module includes a hub, a first body and a second body. The hub is configured to rotate along a central axis. The first body is connected to an outer wall of the hub. The second body is sleeved on the outer wall of the hub. The second body includes a plurality of ribs. The ribs are disposed on an inner wall of the second body and abut against the outer wall of the hub.

10 Claims, 10 Drawing Sheets

FAN MODULE

CROSS-REFERENCE TO RELATED APPLICATION

This application claims the priority benefit of Taiwan Application Serial No. 108131744, filed on Sep. 3, 2019. The entirety of the above-mentioned patent application is hereby incorporated by reference herein and made a part of the specification.

BACKGROUND OF THE INVENTION

Field of the Invention

The disclosure relates to a fan module.

Description of the Related Art

In general, a rotor of a fan includes a plurality of blades connected to a central hub. In consideration of production costs and balance of the fan blade rotor, the fan blade rotor is usually manufactured by injection molding at present. The fan blade rotor produced by injection molding usually includes a demolding problem. Consequently, a structural design of the fan blade is limited.

In addition, as an electronic product is lighter and thinner, the space for installing fans and to dissipate heat from an electronic element is reduced accordingly, and the space between blades is also reduced. As a result, the manufacturing process of the fan blade becomes difficult.

BRIEF SUMMARY OF THE INVENTION

According to an embodiment of the disclosure, a fan module includes a hub, a first body, and a second body. The hub is configured to rotate along a central axis. The first body is connected to an outer wall of the hub. The second body is sleeved on the outer wall of the hub. The second body includes a plurality of ribs. The ribs are disposed on an inner wall of the second body and abut against the outer wall of the hub.

In conclusion, in the fan module of the disclosure, a fan rotor blade structure is separated into more than two elements to facilitate demolding production of blades respectively. The separate fan bodies are then combined into a desired fan blade rotor structure through assembly. In this way, a demolding problem during production and manufacturing is overcome, and a limitation on a structural design of a fan blade is reduced. Furthermore, auxiliary alignment structures such as the ribs, bosses, and alignment portions are disposed on a plurality of fan bodies. Through assistance of the ribs, the bosses and the alignment portions, when the fan module is assembled, accuracy of alignment among the plurality of fan bodies is effectively improved, to ensure uniformity of concentricity of the fan bodies after assembly, flatness of fit among the fan bodies and correct alignment among angular orientations of the fan bodies in a rotating direction.

The foregoing descriptions are merely used for describing a problem to be resolved by the disclosure, technical means for resolving the problem, and an effect generated by the disclosure. Specific details of the disclosure are described in detail in the following embodiments and related figures.

DETAILED DESCRIPTION OF THE EMBODIMENTS

Various embodiments of the disclosure will be disclosed in the accompanying drawings, and for purposes of clarity of illustration, numerous practical details will be set forth in the following description. It should be understood, however, that these practical details are not intended to limit the disclosure. That is, in some embodiments of the disclosure, such practical details are unnecessary. In addition, some well-known and customary structures and elements will be shown in the drawings in a simple schematic manner for the sake of simplifying the drawings.

Figure 1:
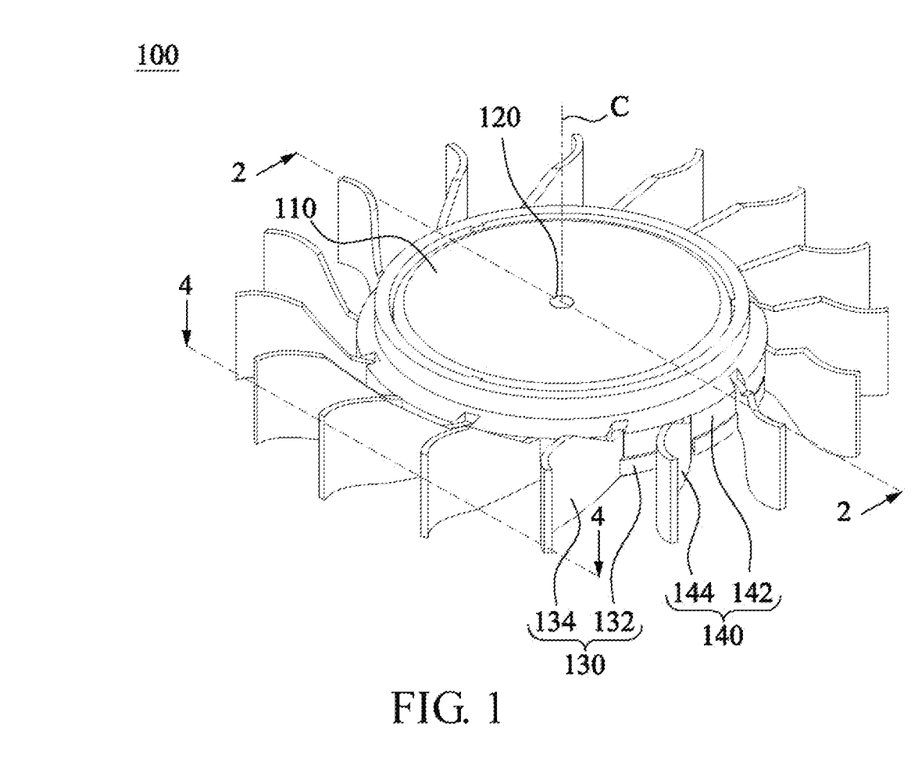
FIG. 1 is a three-dimensional diagram of a fan module according to an embodiment of the disclosure.
Figure 2:
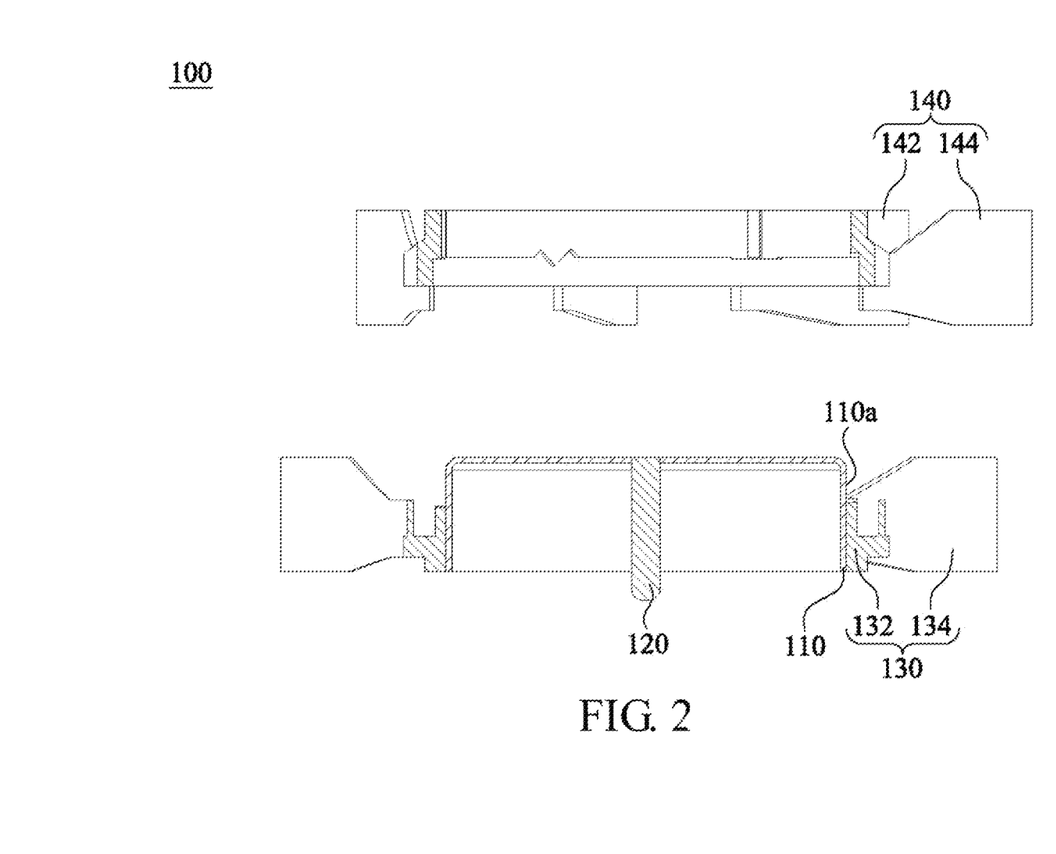
FIG. 2 is an exploded cross-sectional view of the fan module in FIG. 1 taken along line 2-2.
Figure 3:
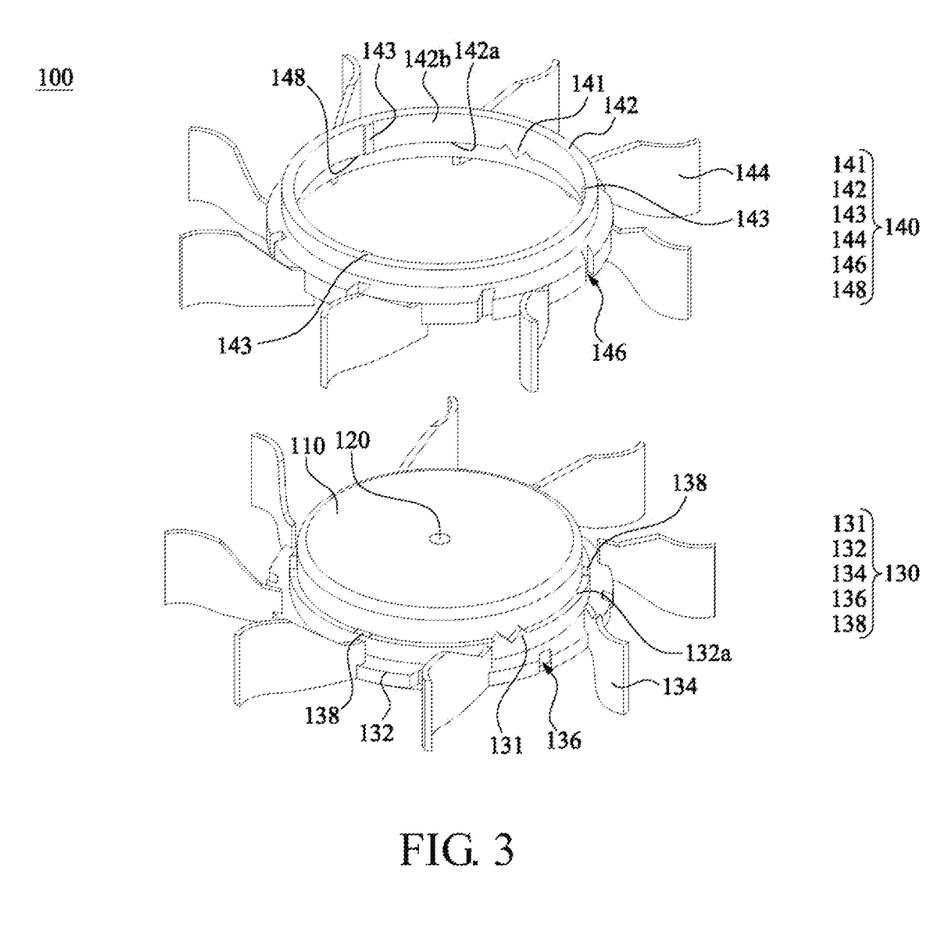
FIG. 3 is an exploded view of the fan module in FIG. 1.

Refer to FIG. 1 to FIG. 3. FIG. 1 is a three-dimensional diagram of a fan module 100 according to an embodiment of the disclosure. FIG. 2 is an exploded cross-sectional view of the fan module 100 in FIG. 1 taken along line 2-2. FIG. 3 is an exploded view of the fan module 100 in FIG. 1.

The fan module 100 of this embodiment is installed in an electronic device so as to dissipate heat from an electronic element in the electronic device to avoid excessively high temperature affecting the electronic element. In some embodiments, the electronic device is a notebook computer, a tablet computer, a desktop computer, or the like. The disclosure is not limited thereto.

As shown in FIG. 1 and FIG. 2, the fan module 100 includes a hub 110, a rotating shaft 120, a first body 130, and a second body 140. The hub 110 is configured to rotate along a central axis C. In this embodiment, the rotating shaft 120 is integrally connected to the hub 110, and a position of the rotating shaft 120 coincides with a position of the central axis C. In another embodiment, the rotating shaft 120 and the hub 110 are two different elements and are fixedly connected to each other. The first body 130 includes a first ring-shaped structure 132 and a plurality of first blades 134 (only one of which is illustratively shown). The first ring-shaped structure 132 of the first body 130 is connected to an outer wall 110a of the hub 110. The plurality of first blades 134 is connected to the first ring-shaped structure 132 and extends in a direction far away from the hub 110.

The second body 140 includes a second ring-shaped structure 142 and a plurality of second blades 144 (only one of which is illustratively shown). The second ring-shaped structure 142 of the second body 140 is sleeved on the outer wall 110a of the hub 110 and is overlapped with the first ring-shaped structure 132. The plurality of second blades 144 is connected to the second ring-shaped structure 142 and extends in a direction far away from the hub 110.

In this embodiment, the plurality of first blades 134 and the plurality of second blades 144 are alternately arranged around the central axis C. In other words, each first blade 134 locates between two neighboring second blades 144, and each second blade 144 locates between two neighboring first blades 134, but the disclosure is not limited thereto.

In some embodiments, the rotating shaft 120, the hub 110 and the first body 130 are combined through injection molding, but the disclosure is not limited thereto.

As shown in FIG. 3, the first body 130 further includes a plurality of first accommodating grooves 136 (only one of which is illustratively shown), a plurality of first bosses 138, and a plurality of first alignment portions 131. In this embodiment, three first bosses 138 and two first alignment portions 131 (some of the first bosses 138 and the first alignment portions 131 are not shown in the drawings due to visual angles) are exemplified for description.

The first accommodating groove 136 is formed at an outer edge of the first ring-shaped structure 132. Each first accommodating groove 136 is disposed between the two neighboring first blades 134. Specifically, the first accommodating grooves 136 are disposed at positions corresponding to the plurality of second blades 144 of the second body 140. When the second body 140 is sleeved outside the hub 110, the first accommodating groove 136 is used to accommodate the second blade 144 so that the first blade 134 is more closely fitted with the second blade 144.

After the first body 130 and the second body 140 are assembled, the fan module 100 also includes dense fan bodies. In other words, the fan module 100 includes a larger quantity of fan bodies. A large quantity of blades indicates a relatively large air output of the fan module 100 and a good heat dissipation effect relatively. The first boss 138 and the first alignment portion 131 are disposed on a top surface 132a of the first ring-shaped structure 132, that is, a surface of the first body 130 facing the second body 140. The first boss 138 and the first alignment portion 131 are described in more detail below.

The second body 140 further includes a plurality of second accommodating grooves 146 (only one of which is illustratively shown on the figure), a plurality of second bosses 148 and a plurality of second alignment portions 141 and ribs 143. In this embodiment, three second bosses 148 and two second alignment portions 141 (some of the second bosses 148 and the second alignment portions 141 are not shown on the figure due to visual angles) are exemplified for description.

Similarly, a second accommodating groove 146 is formed at an outer edge of the second ring-shaped structure 142. Each second accommodating groove 146 is disposed between two neighboring second blades 144. When the second body 140 is sleeved outside the hub 110, the second accommodating groove 146 is used to accommodate the first blade 134 so that the first blade 134 is more closely fitted with the second blade 144.

The second boss 148 and the second alignment portion 141 are disposed on a bottom surface 142a of the second ring-shaped structure 142, that is, a surface of the second body 140 facing the first body 130. The ribs 143 are disposed on an inner wall 142b of the second body 140 and protrude toward an inner space defined by the second ring-shaped structure 142. The rib 143, the second boss 148 and the second alignment portion 141 are described in more detail below.

Figure 4A:
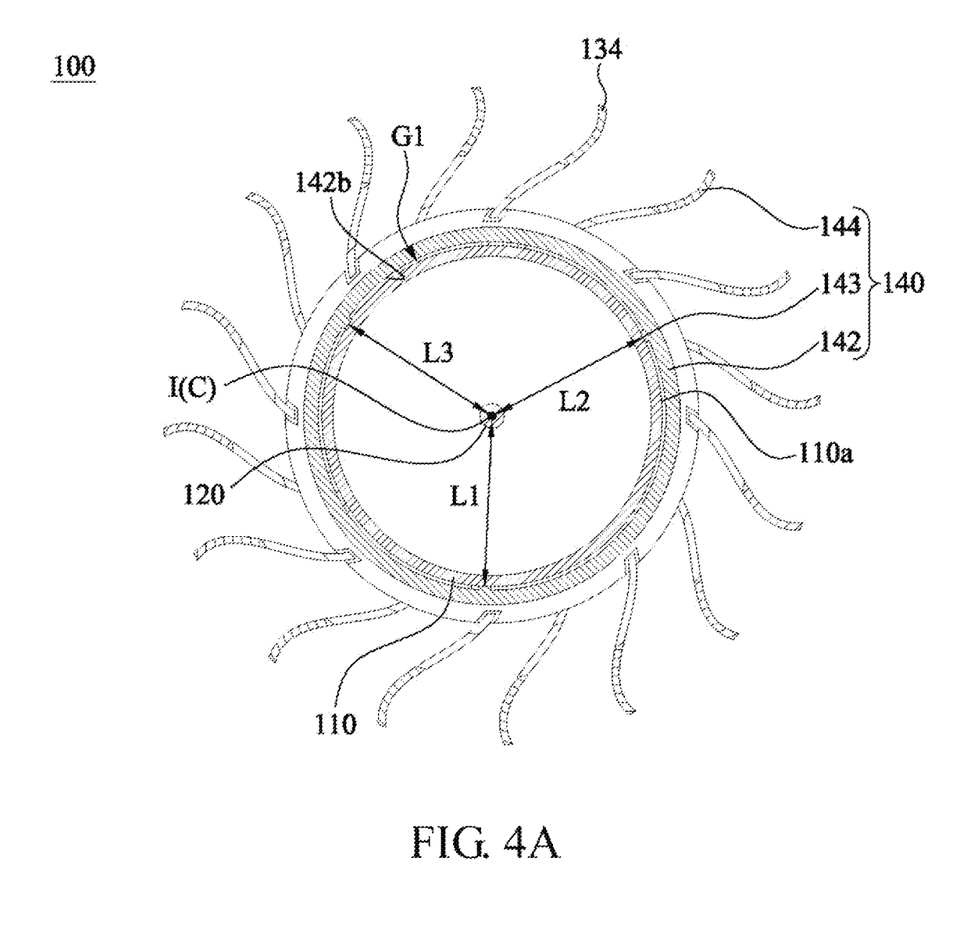
FIG. 4A is a cross-sectional view of the fan module in FIG. 1 taken along line 4-4.
Figure 4B:
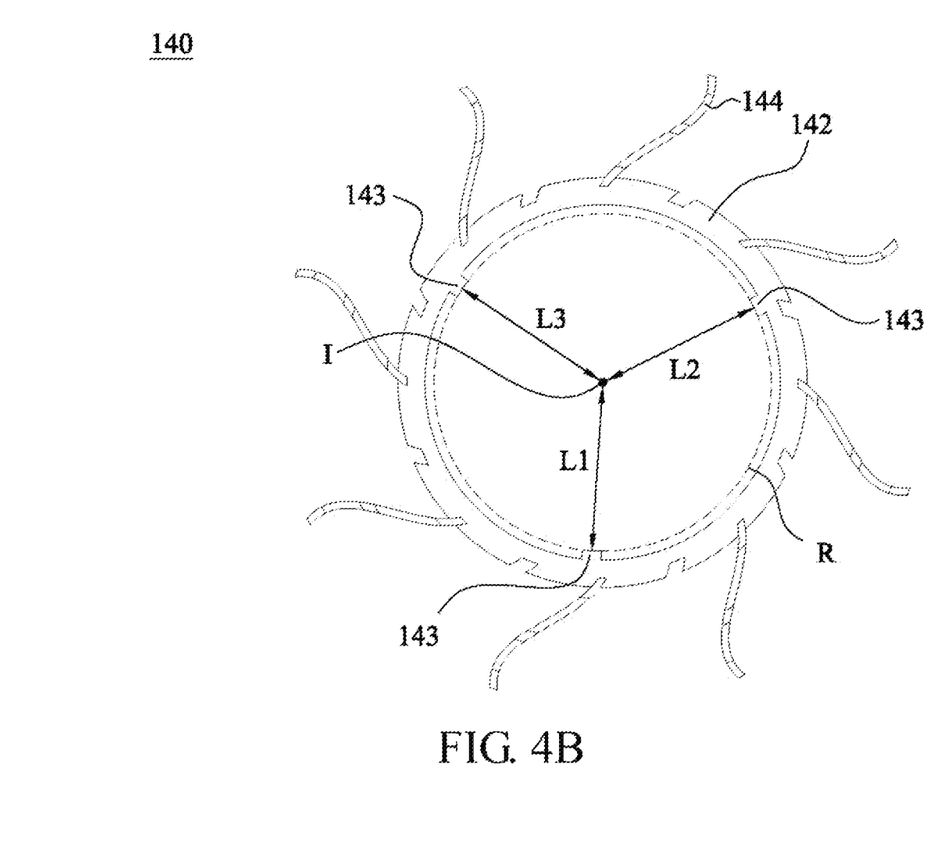
FIG. 4B is a top view of a second body in FIG. 1.

Refer to FIG. 4A and FIG. 4B. FIG. 4A is a cross-sectional view of the fan module 100 in FIG. 1 taken along line 4-4. FIG. 4B is a top view of the second body 140 in FIG. 1. As shown in FIG. 4A, when the second body 140 is sleeved outside the hub 110, the ribs 143 of the second body 140 abut against the outer wall 110a of the hub 110. In this embodiment, the number of the ribs 143 is three, but the disclosure is not limited thereto. In other words, the number of the ribs 143 is elastically adjusted depending on an actual operation.

The fan body is mostly made in a plastic molding manner. However, there are some shrinkage and deformation phenomena in a manufacturing process for plastic molded parts. Therefore, dimensional accuracy of the plastic molded parts is not easy to meet an expected requirement in an aspect of dimensional control. As a result, accuracy in assembly of the parts and smoothness in an operation of the fan are affected. Therefore, through arrangement of the ribs 143 in the disclosure, it doesn't matter whether the accuracy in a size of a proper circle of the second ring-shaped structure 142 during manufacturing is high or low, and further to ensure concentricity of the first body 130 and the second body 140 after combination.

Specifically, the three ribs 143 are evenly distributed on the inner wall 142b of the second ring-shaped structure 142, but the disclosure is not limited thereto. When the second body 140 is sleeved on the hub 110, distances L1, L2, L3 from the three ribs 143 to the central axis C are equal to each other in a cross section perpendicular to the central axis C (the cross section shown in FIG. 4A).

In other words, the three ribs 143 form a virtual inscribed circle R (as shown in FIG. 4B). A center I of the inscribed circle R coincides with the central axis C. Therefore, the distances L1, L2, L3 from the three ribs 143 to the central axis C are the radius of the inscribed circle R. The first ring-shaped structure 132 of the first body 130 is connected to the hub 110. Therefore, a center of the first ring-shaped structure 132 coincides with the central axis C. That is, when the second body 140 is sleeved on the hub 110, the center I of the inscribed circle R formed with the three ribs 143 and the center of the first ring-shaped structure 132 coincide in a direction parallel to the central axis C.

In this disclosure, "substantially" means allowing existence of a slight tolerance, for example, a tolerance within approximately 5%. The disclosure is not limited thereto.

As the foregoing structural design, when the second body 140 is manufactured and designed, the concentricity of the first body 130 and the second body 140 during assembly is ensured only by adjusting the size of the three ribs 143 to enable the center I to coincide with the central axis C, so as to avoid a problem of unstable rotation of the fan due to inconsistent center positions of the fan bodies after assembly.

In addition, a gap G1 is maintained between the hub 110 and the inner wall 142b of the second ring-shaped structure 142. The gap G1 is used as an accommodating space for exhaust air and filling of fixed glue during assembly. A good exhaust air and glue accommodating space help to alleviate extrusion deformation of the structure.

In some embodiments, a surface of the rib 143 abutting against the outer wall 110a of hub 110 is a plane, a concave arc surface or a convex arc surface. In other embodiments, the rib 143 abuts against the outer wall 110a of the hub 110 on only a contact line or a contact surface. In an embodiment, the surface of the rib 143 abutting against the outer wall 110a of the hub 110 is a convex arc surface, and the convex arc surface of the rib 143 is tangent to the outer wall 110a of the hub 110 so that the rib 143 abuts against the outer wall 110a of the hub 110 on only a contact line, but the disclosure is not limited thereto.

Figure 5:
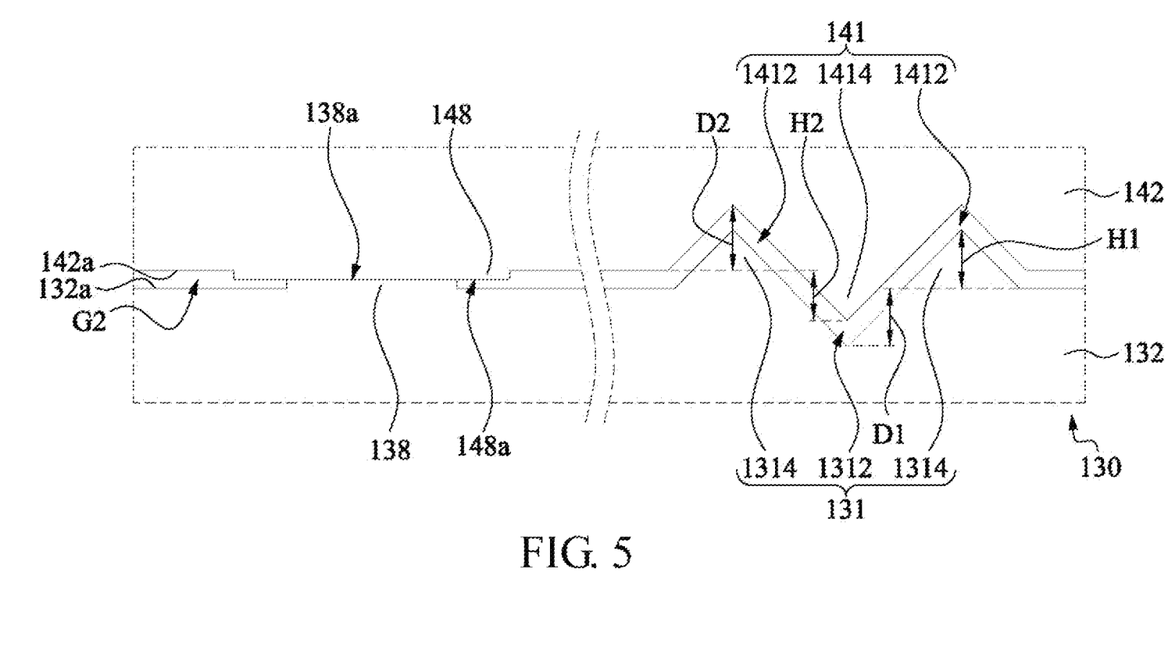
FIG. 5 is a partial schematic diagram of the fan module in FIG. 1.

Refer to FIG. 5. FIG. 5 is a partial schematic diagram of the fan module 100 in FIG. 1. Specifically, FIG. 5 is an enlarged partial view of the first boss 138, the second boss 148, the first alignment portion 131, and the second alignment portion 141. For ease of description, the first ring-shaped structure 132 and the second ring-shaped structure 142 are depicted in FIG. 5 in a plane manner, but the disclosure is not limited to that shown in FIG. 5.

In the following, one first boss 138, one second boss 148, one first alignment portion 131 and the second alignment portion 141 are described as an example, but the remaining first boss 138, the remaining second boss 148, the remaining first alignment portion 131 and the remaining second alignment portion 141 are also described with reference to the following.

As shown in FIG. 5, the first boss 138 protrudes toward the second body 140. The second boss 148 protrudes toward the first body 130. Each first boss 138 includes a first plane 138a. The first plane 138a faces the second body 140. The first plane 138a is parallel to the top surface 132a of the first ring-shaped structure 132, and the three first planes 138a of the three first bosses 138 are coplanar. The second boss 148 includes a second plane 148a facing the first body 130. The second plane 148a is parallel to the bottom surface 142a of the second ring-shaped structure 142, and the three second planes 148a of the three second bosses 148 are coplanar. The three first bosses 138 are disposed corresponding to three second bosses 148. When the second body 140 is sleeved on the hub 110, the three first planes 138a abut against the corresponding second planes 148a.

Generally, there are shrinkage and deformation phenomena when plastic parts are formed. Therefore, in practice, the top surface 132a of the first ring-shaped structure 132 and the bottom surface 142a of the second ring-shaped structure 142 are not ideal planes. In this way, tilt of the upper and lower fan blade members is easily caused during assembly. Therefore, by disposing the first bosses 138 and the second bosses 148, only the flatness of the first planes 138a and the second planes 148a needs to be adjusted so that a plurality of first planes 138a or a plurality of second planes 148a are coplanar with each other. Then the first planes 138a abut against and are in contacts with the second planes 148a by abutting against each other, so that a problem of unevenness of the top surface 132a and the bottom surface 142a is solved, such that the flatness and the fitness between the first body 130 and the second body 140 after assembly is ensured.

Furthermore, since the first boss 138 and the second boss 148 protrude relative to the top surface 132a of the first ring-shaped structure 132 and the bottom surface 142a of the second ring-shaped structure 142 respectively, and abut against each other, there is a gap G2 between the top surface 132a of the first ring-shaped structure 132 and the bottom surface 142a of the second ring-shaped structure 142. The gap G2 is used as an accommodating space for the exhaust air and filling of the fixed glue during assembly. The good exhaust air and glue accommodating space help to alleviate the extrusion deformation of the structure.

In some embodiments, heights of the first boss 138 and the second boss 148 are at least greater than or equal to a maximum height of a convex-concave structure on the top surface 132a or the bottom surface 142a. Relevant data is associated with a device used in a manufacturing process, and is not limited herein.

In this embodiment, a width of the first boss 138 is less than a width of the second boss 148. In another embodiment, the width of the first boss 138 is equal to the width of the second boss 148. In other embodiments, the width of the first boss 138 is greater than the width of the second boss 148. The disclosure is not limited thereto.

In some embodiments, the numbers and locations of the first bosses 138 and the second bosses 148 are elastically adjusted depending on an actual situation, and the disclosure is not limited thereto.

In some embodiments, a total area of the plurality of first planes 138a is approximately less than or equal to one tenth of an area of the top surface 132a. A total area of the plurality of second planes 148a is also approximately less than or equal to one tenth of an area of the bottom surface 142a. The disclosure is not limited thereto.

Continue referring to FIG. 5. As shown in FIG. 5, the second alignment portion 141 is disposed at a position of the second body 140 corresponding to the first alignment portion 131. The first alignment portion 131 includes a groove 1312 and two protrusions 1314, and the groove 1312 locates between the two protrusions 1314. The groove 1312 is depressed relative to the top surface 132a of the first ring-shaped structure 132. The two protrusions 1314 protrude relative to the top surface 132a of the first ring-shaped structure 132. Further, a depression depth D1 of the groove 1312 relative to the top surface 132a is approximately equal to a protrusion height H1 of the two protrusions 1314 relative to the top surface 132a.

Correspondingly, the second alignment portion 141 includes two grooves 1412 and a protrusion 1414, and the protrusion 1414 locates between the two grooves 1412. The two grooves 1412 are depressed relative to the bottom surface 142a of the second ring-shaped structure 142. The protrusion 1414 protrudes relative to the bottom surface 142a of the second ring-shaped structure 142.

A depression depth D2 of the grooves 1412 relative to the bottom surface 142a is approximately equal to a protrusion height H2 of the two protrusions 1314 relative to the bottom surface 142a. Further, the depression depth D2 of the two grooves 1412 is approximately equal to the protrusion height H1 of the two protrusions 1314. The protrusion height H2 of the protrusions 1414 is approximately equal to the depression depth D1 of the groove 1312. When the second body 140 is overlapped on the first body 130, the two grooves 1412 are engaged with the two protrusions 1314, and the protrusion 1414 is engaged with the groove 1312.

During assembly, clamping and alignment of the second alignment portion 141 and the first alignment portion 131 assist in guiding the overlapping of the second body 140 and the first body 130 in a rotating direction of the blades, to ensure that a relative position between each second blade 144 and each first blade 134 accords with expectations. In addition, for a fan with a small size, a matching design of a groove structure and a protrusion structure achieve a more obvious and effective guiding effect in a limited structure space, so that the fan module 100 is more accurately assembled and aligned in a rotating direction.

In some embodiments, the first alignment portion 131 includes a protrusion and two grooves. Correspondingly, the second alignment portion 141 includes two protrusions and a groove, and the disclosure is not limited thereto.

In some embodiments, the shapes and numbers of the first alignment portions 131 and the second alignment portions 148 are elastically adjusted depending on an actual operation, and the disclosure is not limited thereto.

Through the foregoing structural design, the multi-piece combined fan module 100 of the disclosure solves the known problem that demolding cannot be achieved in production and manufacturing, to break through a limitation on the structural design, enable the size of the fan module 100 to be reduced more, and facilitate thinning of the electronic products.

In addition, through auxiliary alignment and guiding functions of the ribs 143, the first boss 138, the second boss 148, the first alignment portion 131 and the second alignment portion 141, an assembly difficulty is reduced, assembly accuracy is improved, and the fan module 100 achieves good assembly quality. Further, unlike the known manner in which the rotating shaft is connected to the plastic fan blade, in this embodiment, the rotating shaft 120 is integrally connected to the hub 110, so that a housing member known to cover the hub 110 and carry the rotating shaft 120 is omitted. In this way, the thinning of the fan module 100 is facilitated.

Figure 6A:
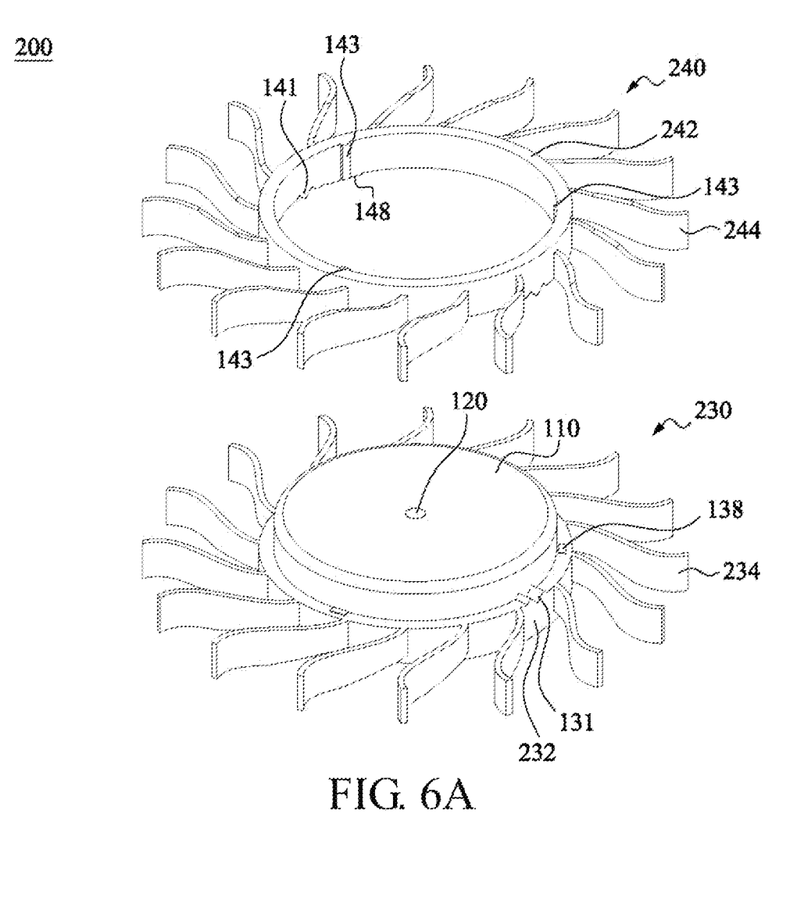
FIG. 6A is an exploded view of a fan module according to another embodiment of the disclosure.
Figure 6B:
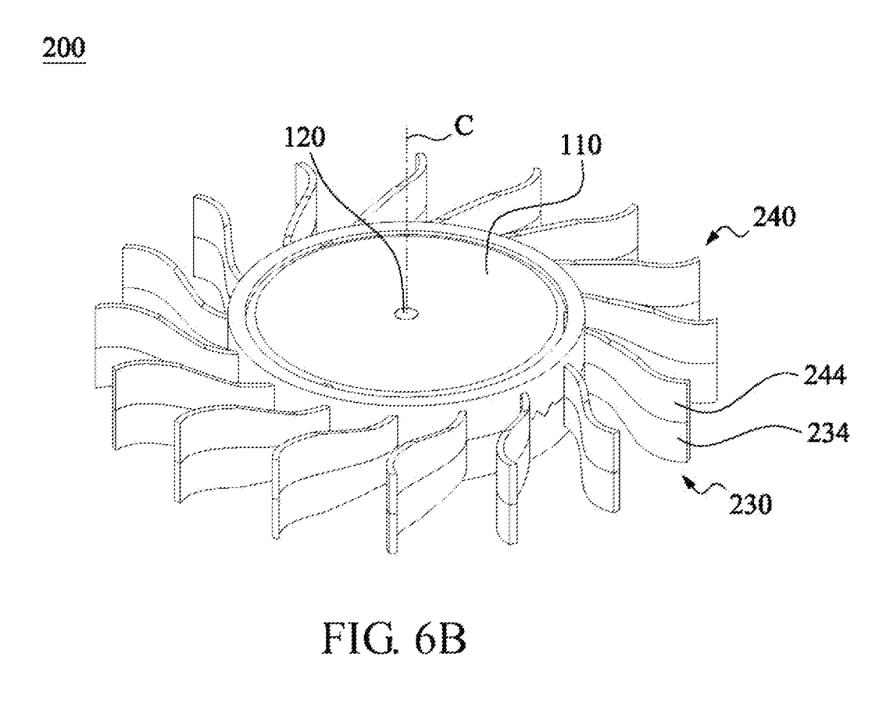
FIG. 6B is a three-dimensional diagram of the fan module in FIG. 6A.

Refer to FIG. 6A and FIG. 6B. FIG. 6A is an exploded view of a fan module 200 according to another embodiment of the disclosure. FIG. 6B is a three-dimensional diagram of the fan module 200 in FIG. 6A. As shown in FIG. 6A, in this embodiment, the fan module 200 includes a hub 110, a rotating shaft 120, a first body 230, and a second body 240. The first body 230 includes a first ring-shaped structure 232, a plurality of first blades 234, a first boss 138, and a first alignment portion 131.

The second body 240 includes a second ring-shaped structure 242, a plurality of second blades 244, ribs 143, a second boss 148, and a second alignment portion 141. The hub 110, the rotating shaft 120, the first boss 138, the first alignment portion 131, the ribs 143, the second boss 148, and the second alignment portion 141 in this embodiment are all the same as those in the embodiment shown in FIG. 1. Therefore, reference is made to the above-mentioned related description, and details are not described herein again. This embodiment differs from the embodiment shown in FIG. 1 in that in this embodiment, when the second body 240 is sleeved outside the hub 110, each second blade 244 is overlapped with a corresponding first blade 234. In other words, the second blade 244 is aligned with the corresponding first blade 234 in a direction parallel to the central axis C (as shown in FIG. 6B).

In this embodiment, since the plurality of first blades 234 and the plurality of second blades 244 are not alternately arranged around the central axis C, the first accommodating groove 136 and the second accommodating groove 146 in the foregoing embodiment are selectively omitted from the first ring-shaped structure 232 or the second ring-shaped structure 242.

Figure 7A:
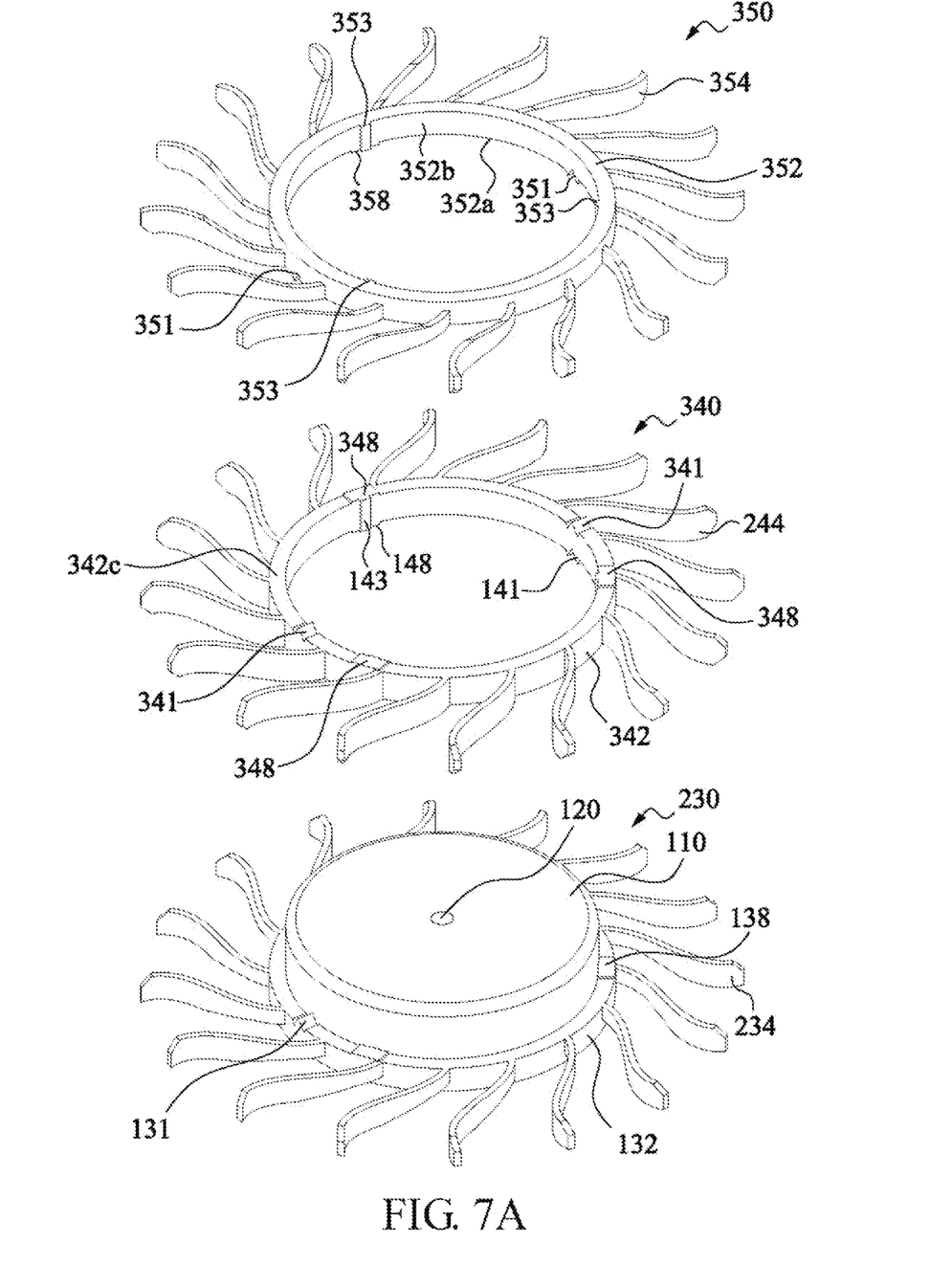
FIG. 7A is an exploded view of a fan module according to yet another embodiment of the disclosure.
Figure 7B:
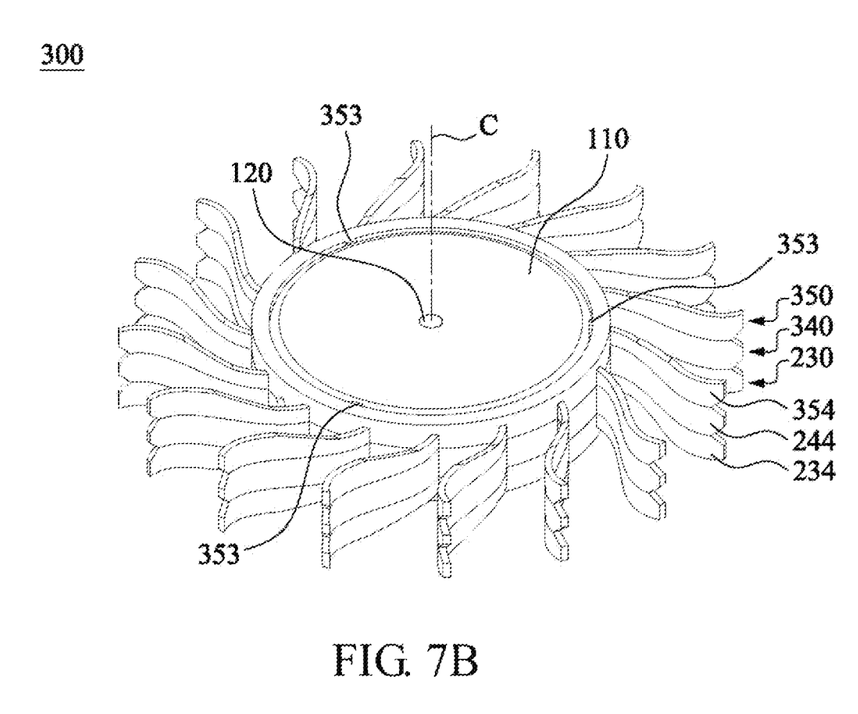
FIG. 7B is a three-dimensional diagram of the fan module in FIG. 7A.

Refer to FIG. 7A and FIG. 7B. FIG. 7A is an exploded view of a fan module 300 according to yet another embodiment of the disclosure. FIG. 7B is a three-dimensional diagram of the fan module 300 in FIG. 7A. As shown in FIG. 7A, in this embodiment, the fan module 300 includes a hub 110, a rotating shaft 120, a first body 230, and a second body 340.

The first body 230 includes a first ring-shaped structure 232, a plurality of first blades 234, a first boss 138, and a first alignment portion 131. The second body 340 includes a second ring-shaped structure 342, a plurality of second blades 244, ribs 143, a second boss 148, and a second alignment portion 141.

The hub 110, the rotating shaft 120, the first ring-shaped structure 232, the first boss 138, the first alignment portion 131, the first blade 234, the ribs 143, the second boss 148, the second alignment portion 141 and the second blade 244 in this embodiment are all the same as those in the embodiment shown in FIG. 6A and FIG. 6B. Therefore, reference is made to the above-mentioned related description, and details are not described herein again. This embodiment differs from the embodiment shown in FIG. 6A and FIG. 6B in that in this embodiment, the fan module 300 further includes a third body 350. The third body 350 is sleeved outside the hub 110 and is overlapped on the second body 340 (as shown in FIG. 7B). The third body 350 includes a third ring-shaped structure 352, a plurality of third blades 354, a third boss 358, a third alignment portion 351, and ribs 353.

Similar to the structural design of the ribs 143 described above, the ribs 353 are disposed on an inner wall 352*b* of the third ring-shaped structure 352. Similarly, as previously described, the ribs 353 are used to assist in adjusting the accuracy of the proper circle in size of the third body 350 so as to ensure concentricity of the third body 350, the first body 130 and the second body 340 after combination. For a detailed design and operation principles, reference is made to the related description of the foregoing ribs 143.

The third boss 358 and the third alignment portion 351 are disposed on a bottom surface 352*a* of the third ring-shaped structure 352, that is, a surface of the third ring-shaped structure 352 facing the second body 340. Correspondingly, a top surface 342*c* of the second ring-shaped structure 342, that is, a surface of the second ring-shaped structure 342 facing the third body 350, includes a fourth boss 348 and a fourth alignment portion 341.

When the third body 350 and the second body 340 are sleeved outside the hub 110, the third boss 358 abuts against the fourth boss 348. The third alignment portion 351 is engaged with the fourth alignment portion 341. Therefore, flatness of fit between the second body 340 and the third body 350 and angular orientations of the second body 340 and the third body 350 in a rotation direction of the fan module 300 is ensured.

The fourth boss 348, the third boss 358, the fourth alignment portion 341 and the third alignment portion 351 have same configurations and functions as those of the above-mentioned first boss 138, the second boss 148, the first alignment portion 131 and the second alignment portion 141 that are described above. Therefore, for a detailed design and operation principles, reference is made to the foregoing related description of the first boss 138, the second boss 148, the first alignment portion 131, and the second alignment portion 141 that are described above, and details are not described herein again.

In this embodiment, when the third body 350 and the second body 340 are sleeved outside the hub 110, the first blade 234, the second blade 244, and the third blade 354 are aligned and overlapped in a direction parallel to the central axis C, as shown in FIG. 7B.

In some embodiments, the first blade 234, the second blade 244, and the third blade 354 are arranged alternately around the central axis C, and this embodiment is not limited thereto.

In some embodiments, the number of fan bodies is two or more, and the disclosure is not limited thereto.

From the foregoing detailed description of specific embodiments of the disclosure, it is apparent that in the fan module of the disclosure, the fan rotor blade structure is separated into more than two elements to facilitate demolding production of blades respectively. The separate fan bodies are then combined into a desired fan blade rotor structure through assembly. In this way, a demolding problem during production and manufacturing is overcome, and a limitation on a structural design of a fan blade is reduced.

Furthermore, auxiliary alignment structures such as the ribs, bosses, and alignment portions are disposed on a plurality of fan bodies. Through assistance of the ribs, the bosses and the alignment portions, when the fan module is assembled, accuracy of alignment among the plurality of fan bodies is effectively improved, to ensure uniformity of concentricity of the fan bodies after assembly, flatness of fit among the fan bodies and angular orientations of the fan bodies in a rotating direction.

Although the disclosure is described above with reference to the embodiments, the embodiments are not intended to limit the disclosure. Any person skilled in the art may make some variations and improvements without departing from the spirit and scope of the disclosure. Therefore, the protection scope of the disclosure should be subject to the appended claims.

What is claimed is:

1. A fan module, comprising:
a hub, configured to rotate along a central axis;
a first body, connected to an outer wall of the hub; and
a second body, sleeved on the outer wall of the hub, wherein the second body comprises a plurality of ribs disposed on an inner wall of the second body and abutting against the outer wall of the hub, wherein the inner wall of the second body has a plurality of sections, each of the sections is located between two of the ribs and is spaced apart from the outer wall of the hub, such that a gap is created between the inner wall of the second body and the outer wall of the hub.

2. The fan module according to claim 1, wherein on a cross section perpendicular to the central axis, distances from the ribs to the central axis are equal to each other.

3. The fan module according to claim 1, wherein the first body comprises a first alignment portion disposed on a first surface of the first body facing the second body, the second body further comprises a second alignment portion disposed on a second surface of the second body facing the first body, and the first alignment portion and the second alignment portion mutually embed with each other.

4. The fan module according to claim 3, wherein one of the first alignment portion and the second alignment portion comprises a first groove and two first protrusions, the first groove locates between the two first protrusions, the other of the first alignment portion and the second alignment portion comprises two second grooves and a second protrusion, and the second protrusion locates between the two second grooves, wherein the first groove is embedded with the second protrusion, and the two first protrusions are embedded with the two second grooves.

5. The fan module according to claim 1, wherein the first body comprises a plurality of bosses disposed on a surface of the first body facing the second body and protruding toward the second body, each of the bosses comprises a top surface, and the top surfaces are coplanar and abut against the second body.

6. The fan module according to claim 1, wherein the second body further comprises a plurality of bosses disposed on a surface of the second body facing the first body and protruding toward the first body, each of the bosses comprises a top surface, and the top surfaces are coplanar and abut against the first body.

7. The fan module according to claim 1, wherein the first body comprises a first boss disposed on a first surface of the first body facing the second body and protruding toward the second body, the second body further comprises a second boss disposed on a second surface of the second body facing the first body and protruding toward the first body, and the first boss abuts against the second boss.

8. The fan module according to claim 1, wherein the fan module further comprises a rotating shaft, and the rotating shaft is integrally connected to the hub.

9. The fan module according to claim 1, wherein the first body and the second body respectively comprise a plurality of blades, and the blades of the first body and the second body are alternately arranged around the central axis.

10. The fan module according to claim 1, wherein the first body and the second body respectively comprise a plurality of blades, and the blades of the second body are aligned with the corresponding blades of the first body in a direction parallel to the central axis.

* * * * *